(12) United States Patent
Koike et al.

(10) Patent No.: US 6,785,146 B2
(45) Date of Patent: Aug. 31, 2004

(54) ELECTRONIC CIRCUIT BOARD FASTENING MEMBER

(75) Inventors: Tatsuo Koike, Kakuda (JP); Mitsuhiro Ito, Takanezawa-machi (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 10/358,221

(22) Filed: Feb. 5, 2003

(65) Prior Publication Data

US 2003/0147228 A1 Aug. 7, 2003

(30) Foreign Application Priority Data

Feb. 6, 2002 (JP) ......................................... 2002-028963

(51) Int. Cl.$^7$ .............................................. H05K 5/06
(52) U.S. Cl. ...................... 361/759; 361/740; 361/741; 361/747; 361/756; 361/801; 361/802; 361/807
(58) Field of Search ................................ 361/683, 684, 361/686, 725–728, 796–799, 740, 741, 747, 756, 759, 801, 802, 807, 752, 737; 174/52.2, 52.3, 52.4, 258; 211/41.17; 312/223.1, 223.2

(56) References Cited

U.S. PATENT DOCUMENTS

| | | | | |
|---|---|---|---|---|
| 4,692,571 A | * | 9/1987 | Trinh et al. .................. | 200/5 A |
| 5,452,184 A | * | 9/1995 | Scholder et al. ............. | 361/799 |
| 5,973,926 A | * | 10/1999 | Sacherman et al. .......... | 361/759 |
| 6,424,540 B1 | * | 7/2002 | Chen et al. .................. | 361/759 |
| 6,445,588 B1 | * | 9/2002 | Masterton et al. ........... | 361/759 |

* cited by examiner

Primary Examiner—Phuong T. Vu
(74) Attorney, Agent, or Firm—Westerman, Hattori, Daniels & Adrian, LLP (57) ABSTRACT

A fastening member for an electronic circuit board having an elastically deformable leg formed in a case for housing the electronic circuit board and a projection formed continuous with the leg to be engaged with the electronic circuit board so as to fasten the electronic circuit board on a prescribed mounting surface in the case. In the member, the projection is engaged with the electronic circuit board such that a prescribed angle is formed between a surface of the projection contacting the electronic circuit board, when the electronic circuit board is fastened on the mounting surface in the case. With this, since the tangent between the board contact surface and the electronic circuit board is variable within the range of the board contact surface, molding error can be tolerated (absorbed) and volumetric variation produced by temperature change can be readily coped with.

2 Claims, 14 Drawing Sheets

|  | MEASURED STRESS/ PERMISSIBLE MAXIMUM STRESS × 100 [%] |
|---|---|
| IN FASTENING BOARD | 8.6 |
| AFTER BOARD ATTACHED | 47.4 |
| VIBRATION TEST | 0.23 |

ELECTRONIC CIRCUIT BOARD FASTENING MEMBER

BACKGROUND OF THE INVENTION

1. Field of the Invention

This invention relates to an electronic circuit board fastening member, particularly to a fastening member for securing an electronic circuit board, more particularly to a claw-like hook for securing an electronic circuit board.

2. Description of the Related Art

Figure 16:
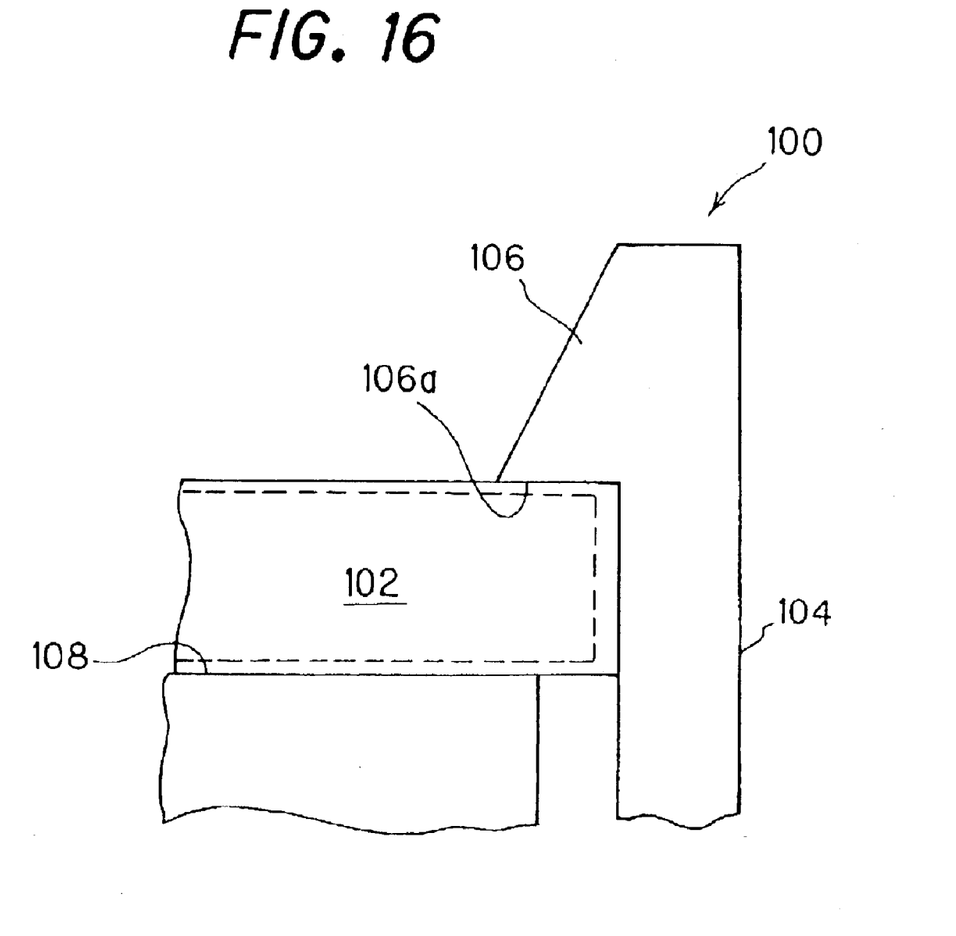
FIG. 16 is an explanatory view showing a fastening member according to the prior art.

A claw-like fastening member like that shown in FIG. 16 has been widely used to fasten an electronic circuit board. This claw-like fastening member, designated by reference numeral 100 in the drawing, is composed of a leg 104 that is elastically deformed during insertion of an electronic circuit board 102 and a projection 106 that immobilizes the electronic circuit board 102 at a prescribed location by restricting its movement in the vertical direction. Lateral movement of the electronic circuit board 102 is restricted by the leg 104 in cooperation with another such leg or a side wall.

This conventional faster 100 has a drawback, however, in the point that play will arise in the vertical direction should the thickness of the electronic circuit board 102 be smaller than the distance between a board contact surface 106a of the projection 106 and a mounting surface 108 (as indicated by the broken line in the drawing). Play will also arise in the lateral direction should the distance between the leg 104 and its counterpart or the side wall be larger than the width of the electronic circuit board 102.

In order to eliminate this drawback, the dimensions of the fastening member 100 and the electronic circuit board 102 must be strictly controlled. But such strict dimensional control is disadvantageous from the cost aspect. In addition, the fastening member 100 and the electronic circuit board 102 experience repeated thermal expansion and thermal contraction when used in an environment subject to extreme temperature changes. If the fastening member 100 is designed based on the dimensions during thermal expansion, lateral and vertical play is liable to arise during thermal contraction.

On the other hand, if the design is based on the dimensions during thermal contraction, excessive stress comes to act on the fastening member 100 and the electronic circuit board 102 during thermal expansion. This may break the fastening member 100 and/or warp the electronic circuit board 102 to the point of cracking its soldering. In addition, the fastener 100 also becomes susceptible to damage under the action of heavy stress produced by vibration or the like.

SUMMARY OF THE INVENTION

An object of the present invention is therefore is to overcome the aforesaid problem by providing a fastening member for an electronic circuit board that can tolerate greater molding error than prior art fastening members and can readily cope with stress produced by volumetric variation owing to temperature change and by vibration.

In order to achieve the foregoing object, this invention in a first aspect provides a fastening member for an electronic circuit board including: an elastically deformable leg formed in a case for housing the electronic circuit board; and a projection formed continuous with the leg to be engaged with the electronic circuit board so as to fasten the electronic circuit board on a prescribed mounting surface in the case; wherein the improvement comprises: the projection is engaged with the electronic circuit board such that a prescribed angle is formed between a surface of the projection contacting the electronic circuit board, when the electronic circuit board is fastened on the mounting surface in the case.

The structure is such that when the electronic circuit board is fastened on the mounting surface, a prescribed angle is formed between the surface of the projection in contact with the electronic circuit board (board contact surface) and the electronic circuit board. Specifically, the board contact surface and the electronic circuit board form the prescribed angle and contact each other tangentially. Since the tangent between the board contact surface and the electronic circuit board is variable within the range of the board contact surface, molding error can be tolerated (absorbed) and volumetric variation produced by temperature change can be readily coped with.

In a second aspect, this invention provides a fastening member for an electronic circuit board, wherein the prescribed angle is determined based on stress acting at a time when the electronic circuit board is fastened on the mounting surface in the case.

Since the prescribed angle is defined in accordance with stress acting (on the electronic circuit board and the fastening member) at a time when the electronic circuit board is in the fastened state, such as stress produced by volumetric variation and/or vibration, the foregoing effects can be obtained to an even higher degree, making utilization possible in virtually any environment.

BRIEF DESCRIPTION OF THE DRAWINGS

The objects and advantages of the invention will be made apparent with reference to the following descriptions and drawings, in which.

DETAILED DESCRIPTION OF THE PREFERRED EMBODIMENTS

A fastening member for an electronic circuit board according to an embodiment of this invention will now be explained with reference to the attached drawings.

Figure 1:
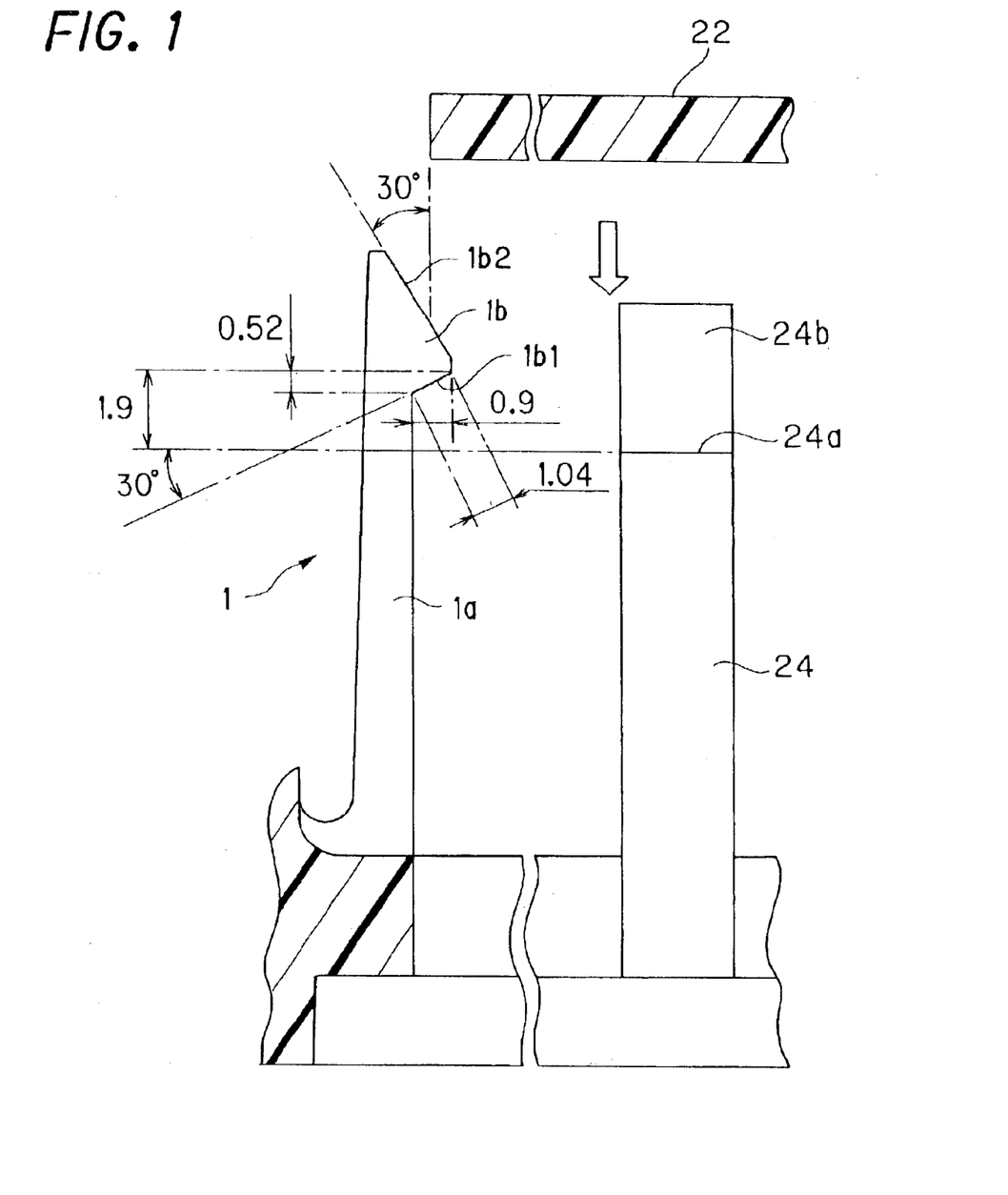
FIG. 1 is an enlarged view of a fastening member for an electronic circuit board according to an embodiment of this invention.

FIG. 1 is an enlarged view of the fastening member.

Figure 2:
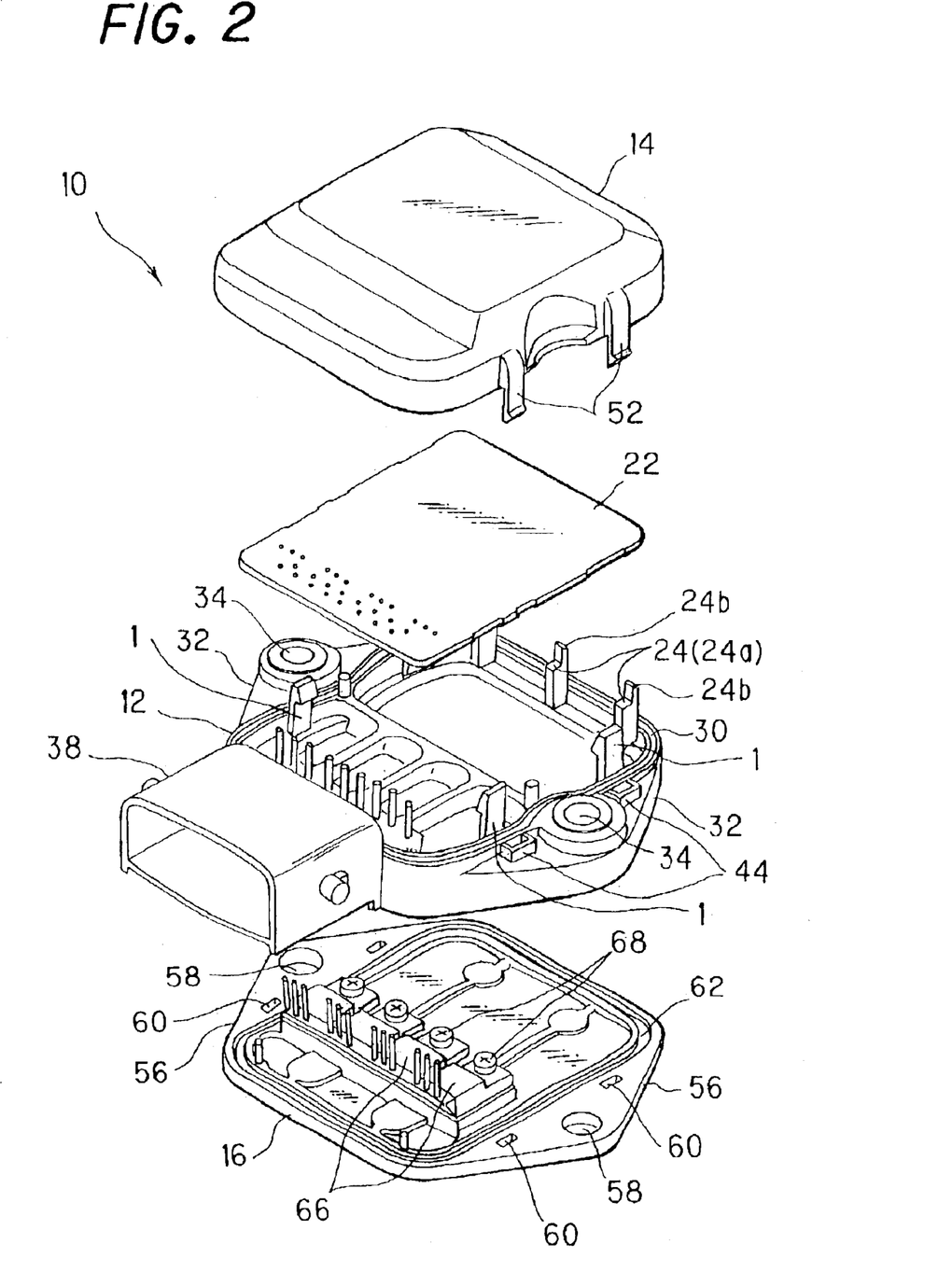
FIG. 2 is a perspective view showing the individual elements of a case in which the fastening member shown in FIG. 1 is formed.

As shown in the drawing, the fastening member of this embodiment, designated by reference numeral 1, is a claw-like hook composed of a leg 1a and a projection 1b continuous therewith. Before going into an explanation of this figure, a case for housing an electronic circuit board (hereinafter called simply a "case") in which the fastening member 1 is formed will be explained with reference to FIG. 2 and the ensuing figures. FIG. 2 is a perspective view showing the individual constituent elements of the case (designated by reference numeral 10 in the drawings). As shown in the drawing, the case 10 is composed of a case body 12 made of resin (PBT), a cover 14 also made of resin (PBT), and a heat sink 16 made of a metal having high heat conductivity (aluminum).

Figure 3:
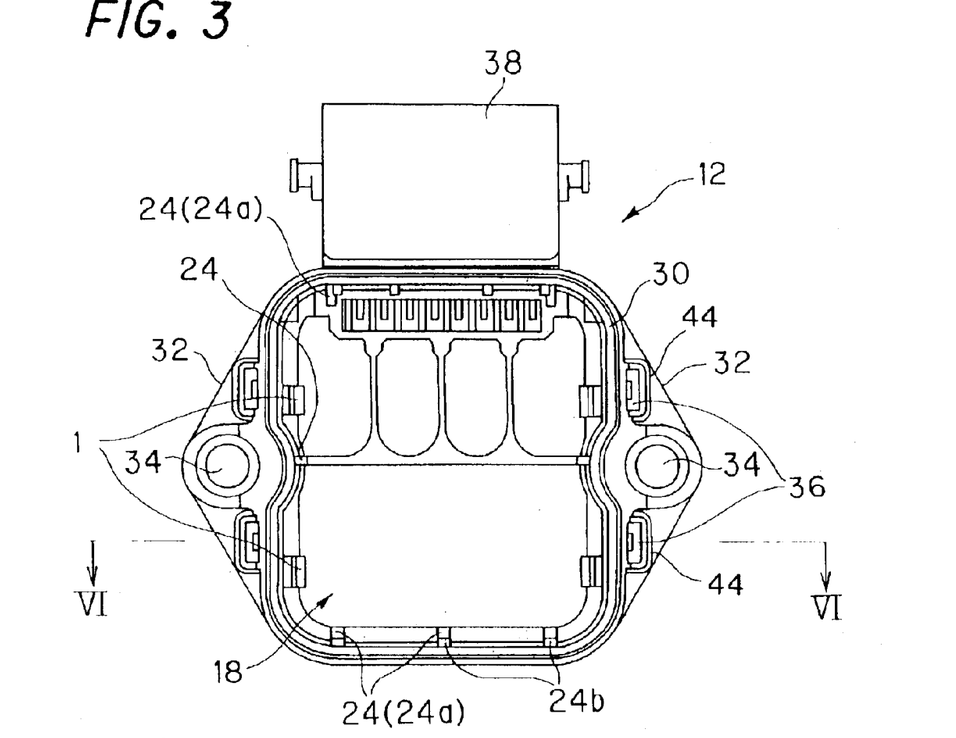
FIG. 3 is a top view of the case body of the case shown in FIG. 2.
Figure 4:
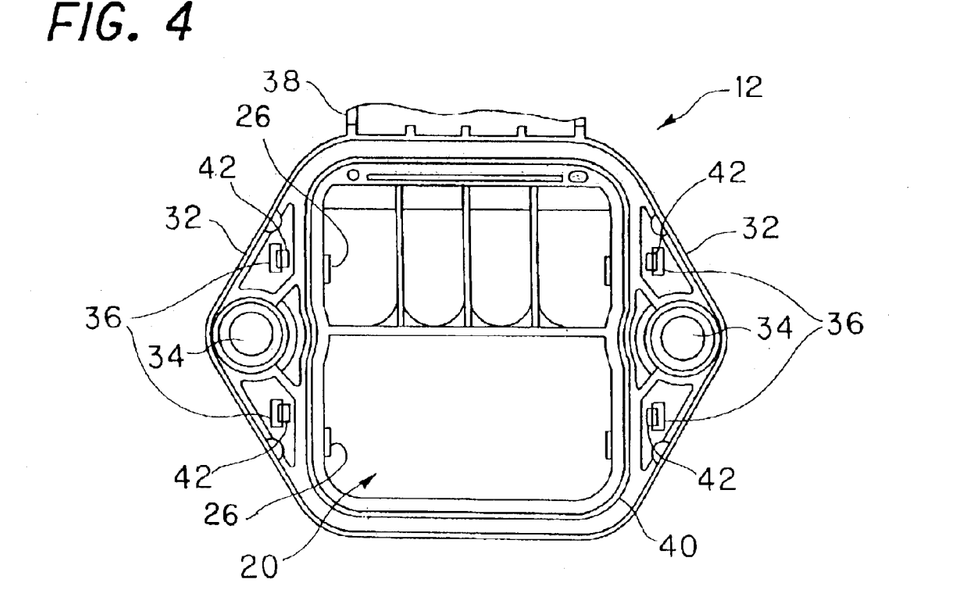
FIG. 4 is a bottom view of the case body of the case shown in FIG. 2.
Figure 5:
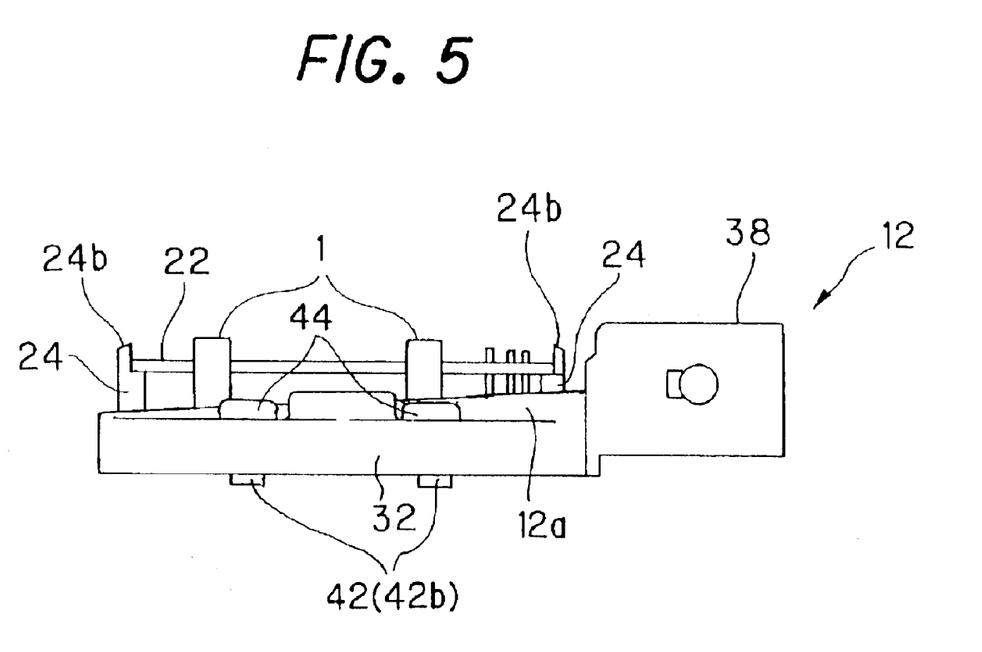
FIG. 5 is side view of the case body of the case shown in FIG. 2.
Figure 6:
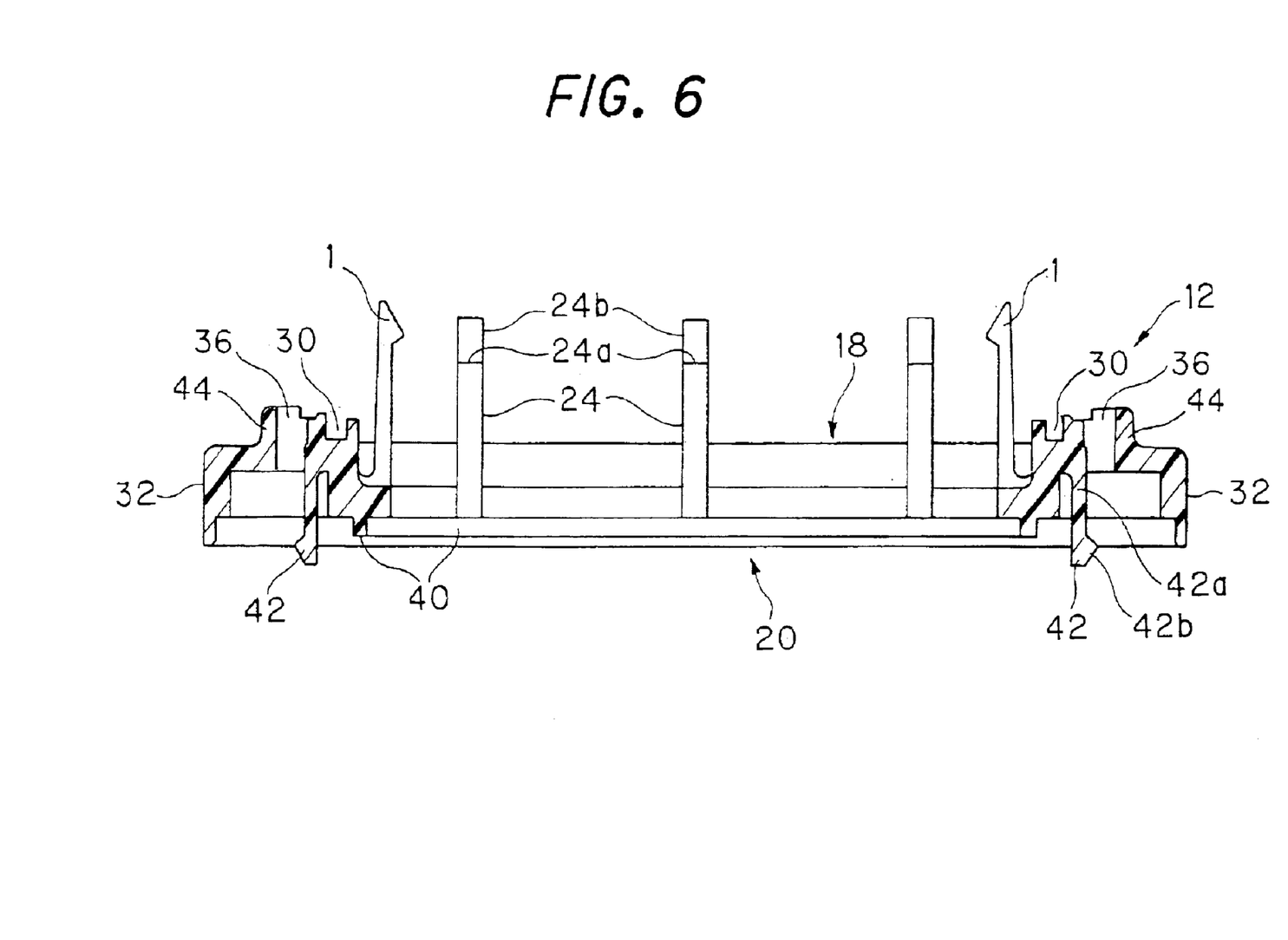
FIG. 6 is an enlarged sectional view taken along line VI—VI in FIG. 3.

FIG. 3 is a top view of the case body 12 and FIG. 4 is a bottom view thereof. (Part of a connector explained later has been omitted from these figures.) FIG. 5 is a side view showing an electronic circuit board in its housed state. FIG. 6 is a sectional view taken along line VI—VI in FIG. 3. The case body 12 will now be explained with reference to FIGS. 2 to 6.

The case body 12 is open over nearly the entire area of its upper surface and lower surface. The opening on the upper surface side will be called "first opening 18" and that on the lower surface side will be called "second opening 20." The case body 12 houses at its interior an electronic circuit board 22 inserted through the first opening 18. (The electronic components mounted on the board 22 are omitted in the drawing.)

The case body 12 encloses an internal space of generally rectangular shape as viewed from the top. A plurality (6) ribs 24 are formed at appropriate locations on the internal space side (inner face) of a side wall 12a. As the cover 14 is also formed with ribs as explained later, the ribs formed on the case body 12 will be called "first ribs." The upper end surfaces 24a of the first ribs 24 collectively serve as a mounting surface for mounting the board 22. First stops 24b for locating the board 22 are formed at the tops of the upper end surfaces 24a toward the outer side of the case.

A plurality of fastening members 1 for fastening the board 22 are also formed on the inner wall of the case body 12. Specifically, four fastening members are formed, two each on opposing sides of the inner wall. The fastening members 1 will hereinafter be called board fastening claws 1.

The explanation will be continued with reference to FIG. 1. As pointed out above, each fastening member 1 comprises an elastically deformable leg 1a and a projection 1b continuous with the leg 1a and projecting toward an electronic circuit board (the board 22), i.e., in the direction of the internal space of the case body 12. The projection 1b is formed at a location upwardly apart from the upper end surface 24a on which the board 22 is mounted by approximately the thickness of the board 22.

The surface that the board 22 contacts when fastened, hereinafter called the "board contact surface 1b1," is tapered toward the internal space side to form an angle of 30 degrees with the upper end surface 24a. The surface 1b2 contacted by the board 22 when it is inserted is tapered to form an angle of 30 degrees with the direction of board 22 insertion so as to facilitate the insertion.

As shown in the drawing, the lateral width of the board contact surface 1b1 is 0.9 mm and its vertical width (height) is 0.52 mm. Since, as explained above, the angle relative to the upper end surface 24a, i.e., relative to horizontal, is 30 degrees, the substantial length of the board contact surface 1b1 is 1.04 mm. The maximum distance in the vertical direction between the upper end surface 24a and the board contact surface 1b1 is 1.9 mm (the minimum distance is 1.9−0.52=1.38 mm), and the thickness of the board 22 is 1.6 mm.

Figure 7:
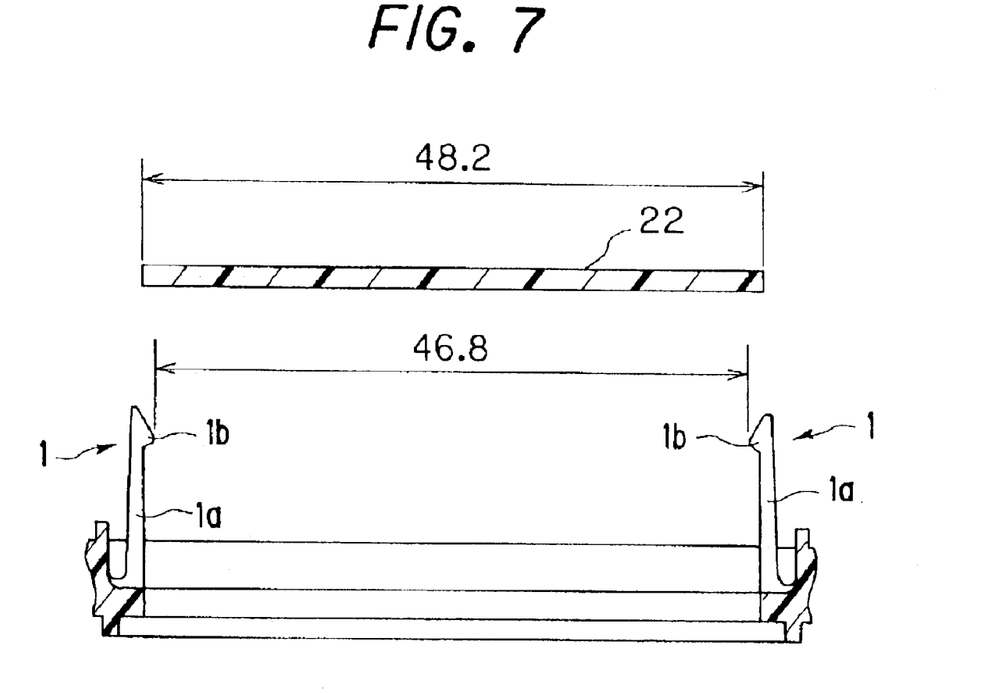
FIG. 7 is a simplified representation of FIG. 6 for explaining the width of a board and the distance between board fastening claws.

FIG. 7 shows the distance between opposing board fastening claws 1 at their legs 1a and at the tips of their projections 1b, and also shows the width of board 22. As shown in the drawing, the distances between the opposing legs 1a and between the tips of the opposing projections 1b are set smaller than the width of the board 22.

Figure 8:
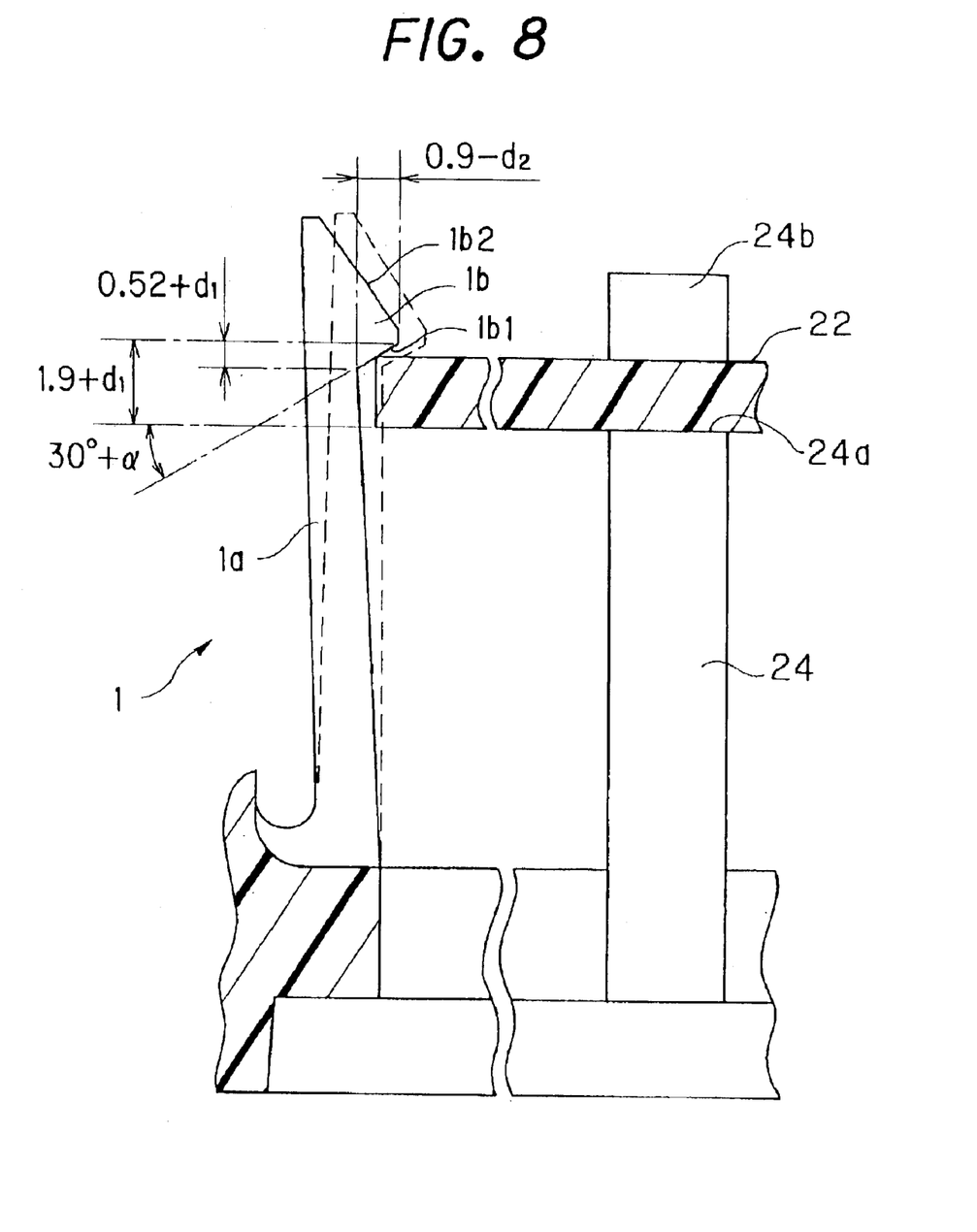
FIG. 8 is an explanatory diagram similar to FIG. 1 showing the fastened state of the board shown in FIG. 2.

FIG. 8 is a diagram for explaining the state of the board fastening claws 1 when the board 22 is fastened. As illustrated, the board 22 is fastened in a prescribed location by clamping it between the upper end surfaces 24a on which it is mounted and the board fastening claws 1 (only one of each shown in FIG. 8). Therefore, so long as the width and thickness of the board 22 can fit within the range of the lateral width and vertical width of the board contact surface 1b1, the board 22 can be clamped between the upper end surfaces 24a and the board contact surfaces 1b1 to achieve fastening at the prescribed location. The board contact surface 1b1 and the board 22 contact tangentially at a prescribed angle. In other words, the structure is such that the tangent between the board contact surface 1b1 and the board 22 is variable within the range of the board contact surface 1b1. Therefore, molding error of the board 22 and the board fastening claws 1, and volumetric variation caused by temperature change, are tolerable within the range of the lateral width and vertical width of the board contact surface 1b1. The force clamping the board 22 depends on the elasticity of the leg 1a.

The fastening of the board 22 on the upper end surfaces 24a elastically deforms the board fastening claws 1, more precisely the legs 1a. This changes the angle between the upper end surfaces 24a and the board contact surfaces 1b1. (The angle after the change, i.e., the angle between the board 22 and the board contact surface 1b1, is defined as 30 degrees+α degrees). Owing to this angle change, the lateral width and the vertical width of the board contact surface 1b1 changes and the maximum distance in the vertical direction between the upper end surface 24a and the board contact surface 1b1 also changes.

Specifically, the greater the elastic deformation of the leg 1a (i.e., the greater the angle between the upper end surface 24a and the board contact surface 1b1 becomes), the larger becomes the vertical width of the board contact surface 1b1 and the maximum distance between the board contact surface 1b1 and the upper end surface 1a (designated+d1), and the smaller becomes the lateral width of the board contact surface 1b1 (designated−d2).

Since $\sin\theta + \cos\theta$ becomes maximum when $\theta = 45$ degrees, maximum molding error and volumetric variation are allowable when the dimensions of the different constituents are defined so that the angle between the upper end surface 24a and the board contact surface 1b1 is 45 degrees when the board 22 is fastened on the upper end surfaces 24a (i.e., so that a becomes 15 degrees). Otherwise, the angle after fastening can be appropriately set according to the stress applied to the board fastening claws 1 and the board 22.

Assume, for example, that the board 22 has the width of 48.2 mm and thickness of 1.6 mm set out above, Then, assuming a coefficient of thermal expansion of 14×10–6 and a temperature variation range of –40° C. to 120° C. (ΔT= 165° C.), it follows that Lateral change=48.2×(14×10–6×165)=0.11 mm, Thickness change=1.6×(14×10–6×165)=0.0037 mm.

The angle after fastening is therefore preferably set at 45 degrees or less to secure a large lateral change allowance. Also in the case of use in an environment where large vertical vibration (stress) is applied, the angle after fastening is preferably set at 45 degrees or less so as to eliminate play by pressing the board 22 downward. The inventors conducted various tests taking the foregoing considerations into account. As a result they learned that when the case 10 is installed in the engine compartment of a vehicle—an environment marked by extreme temperature change and strong vertical vibration—it is possible by setting the value of α between 1 and 3 degrees (i.e., setting the angle after fastening between 31 and 33 degrees) to cope readily with the stress produced by volumetric variation owing to temperature change and by vibration and thus to prevent damage to the board fastening claws 1 and detachment of the board 22.

Figure 9:
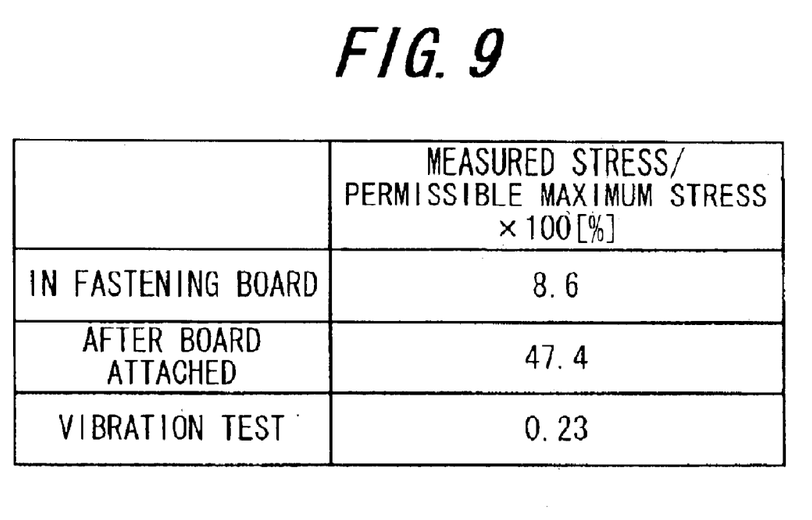
FIG. 9 is a table showing stress acting on the board fastening claws when the board shown in FIG. 2 is fastened.

FIG. 9 shows measured values of the stress acting on the board fastening claws 1 when the board 22 is fastened in the case body 12. In this figure, the term "permissible maximum stress when inserting board" refers to tolerance with respect to instantaneous bending stress, and other permissible maximum stress refers to tolerance with respect to continuous stress (repeated stress). Stress after attachment is the value to be added to the stress produced by the vibration test.

It can be seen from FIG. 9 that the board fastening claw 1 of this embodiment had some leeway, relative to its strength characteristic, in the stress value that could actually be applied. This result, while of course also related to the dimensions of the board fastening claws 1, can be traced largely to the fact the stress acting on the board fastening claws 1 was resolved vertically and laterally owing to the adoption of a structure that resulted in a prescribed angle being formed between the upper end surfaces 24a and the board fastening claws 1 after fastening of the board 22.

From the fact that stress generated in the vibration test was small, moreover, it can be seen that the board 22 did not resonate owing to the vibration but was firmly immobilized by the board fastening claws 1.

Even if the board 22 should expand or contract in response to the ambient temperature environment, the board fastening claws 1, specifically the board contact surfaces 1b1, will follow these changes to keep the board 22 constantly fixed in place free of slack.

The explanation with reference to FIGS. 2 to 6 will be continued. An annular recession 30 is formed at the outer periphery of the first opening 18. Two flanges 32 of triangular shape as viewed from above are formed on the outside (outer face) of the side wall 12a of the case body 12. Each flange 32 is formed with a bolt hole 34 for insertion of a bolt (not shown) and with two first engagement holes 36 that receive cover fastening claws (explained later) and engage their projections.

A connector 38 is formed integrally with the outer side face (outer wall) of the case body 12 so as to project from the side wall. While the connector 38 is formed integrally with the case body 12 in this embodiment, it only needs to be installed at a location where the foregoing purposes can be achieved and can, for example, be provided as a separate body fixed to the case body 12 by bolts or the like.

A first annular ridge 40 is formed at the outer periphery of the second opening 20 on the bottom side of the case body 12. In addition, heat sink fastening claws (fastening members) 42 for fastening the heat sink 16 are formed near the first engagement holes 36. Each heat sink fastening claw 42 is, similarly to the board fastening claw 1, composed of an elastically deformable leg 42a and a projection 42b continuous therewith. It is formed with a surface 42b2 contacted by the heat sink 16 during fastening and a surface that tangentially contacts a prescribed region (explained later) of the heat sink 16 at a prescribed angle after it has been fastened (hereinafter called "heat sink contact surface 42b1").

The explanation of the upper surface side of the case body 12 will be continued. Covers 44 for covering the legs of cover fasting claws (explained later) are formed above the first engagement holes 36. This will be explained in more detail later.

Figure 10:
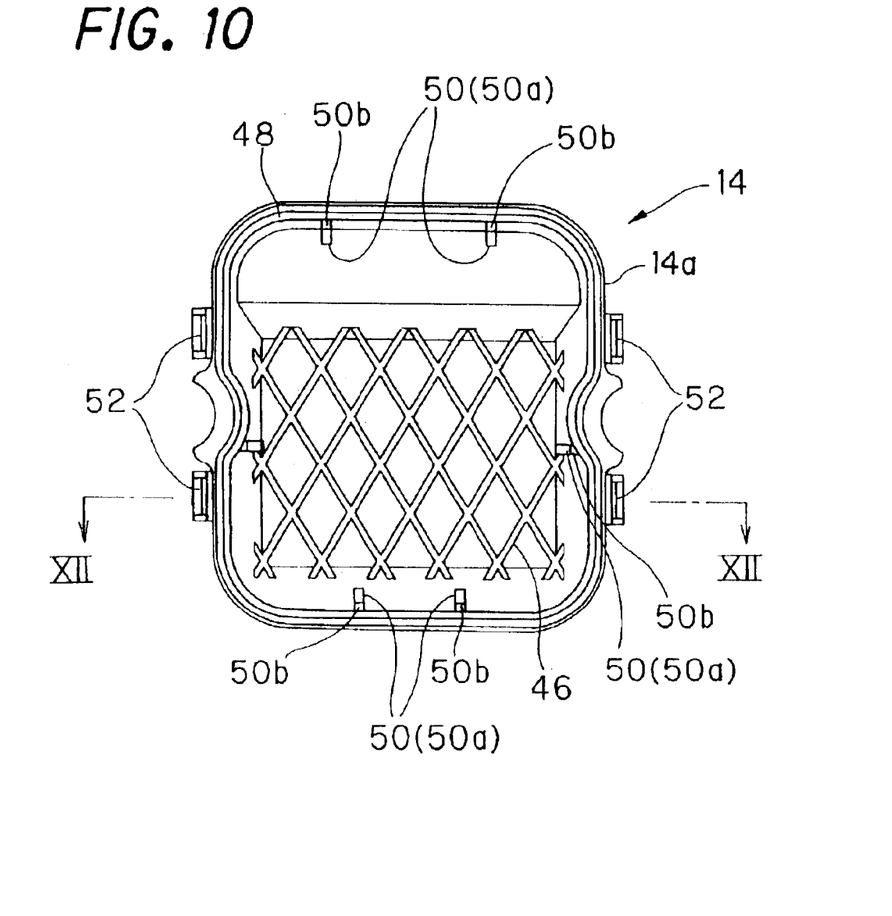
FIG. 10 is a bottom view of a cover of the case shown in FIG. 2.
Figure 11:
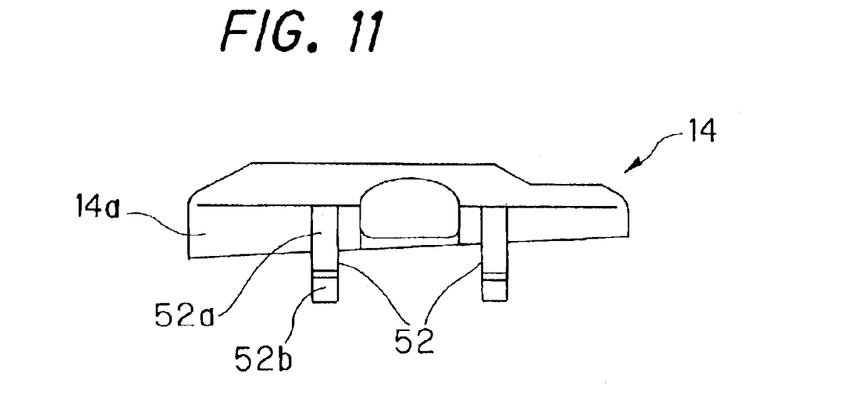
FIG. 11 is a side view of the cover of the case shown in FIG. 2.
Figure 12:
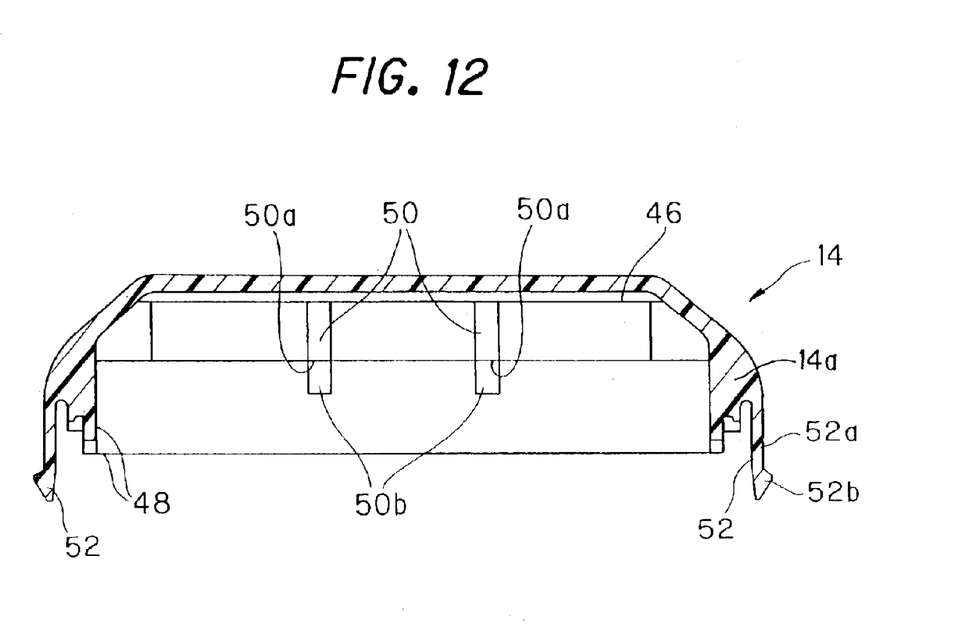
FIG. 12 is an enlarged sectional view taken along XII—XII in FIG. 10.

The cover 14 will now be explained. FIG. 10 is a bottom view of the cover 14 (view from the underside) and FIG. 11 is a side view thereof. FIG. 12 is an enlarged sectional view taken along XII—XII in FIG. 10. The explanation will be made with reference to FIGS. 2, 10 and 12.

The cover 14 is formed to have a rectangular shape as viewed from the bottom. The bottom surface of its side wall is congruent with the opening edge that defines the first opening 18 of the case body 12. Part of the upper surface protrudes upwardly to secure space for accommodating electronic components when the cover 14 is attached to the case body 12. Part of the upwardly protruding surface is reinforced with crosshatched ribs 46.

The aforesaid bottom surface of the side wall of the cover 14 is formed at a location corresponding to the first annular recession 30 of the case body 12 with a second annular ridge 48 for insertion in the first annular recession 30. Further, a plurality (4) of second ribs 50 are formed at appropriate locations on the internal space side (inner face) of the side wall.

The second ribs 50 are formed so that when the cover 14 is attached to the case body 12, the lower end surfaces 50a of the second ribs 50 are situated above the upper end surfaces 24a of the first ribs 24 by a distance equal to the thickness of the board 22. Thus, when the cover 14 is attached to the case body 12, the board 22 is clamped between the upper end surfaces 24a of the first ribs 24 and the lower end surfaces 50a of the second ribs 50. Second stops 50b for locating the board 22 are formed at outward locations of the cover from the lower end surfaces 50a.

Cover fastening claws (fastening members) 52 are formed at the outward sidewall 14a (outer wall) of the cover 14 at locations corresponding to the first engagement holes 36 of the case body 12. Similarly to the heat sink fastening claw 42, each cover fastening claw 52 is composed of an elastically deformable leg 52a and a projection 52b continuous therewith. The projection 52b is formed with a surface 52b2 contacted during fastening of the cover 14 to the case body 12 and a surface that tangentially contacts a prescribed region (explained later) of the case body 12 at a prescribed angle after the cover 14 has been fastened (hereinafter called "case body contact surface 52b1").

Figure 13:
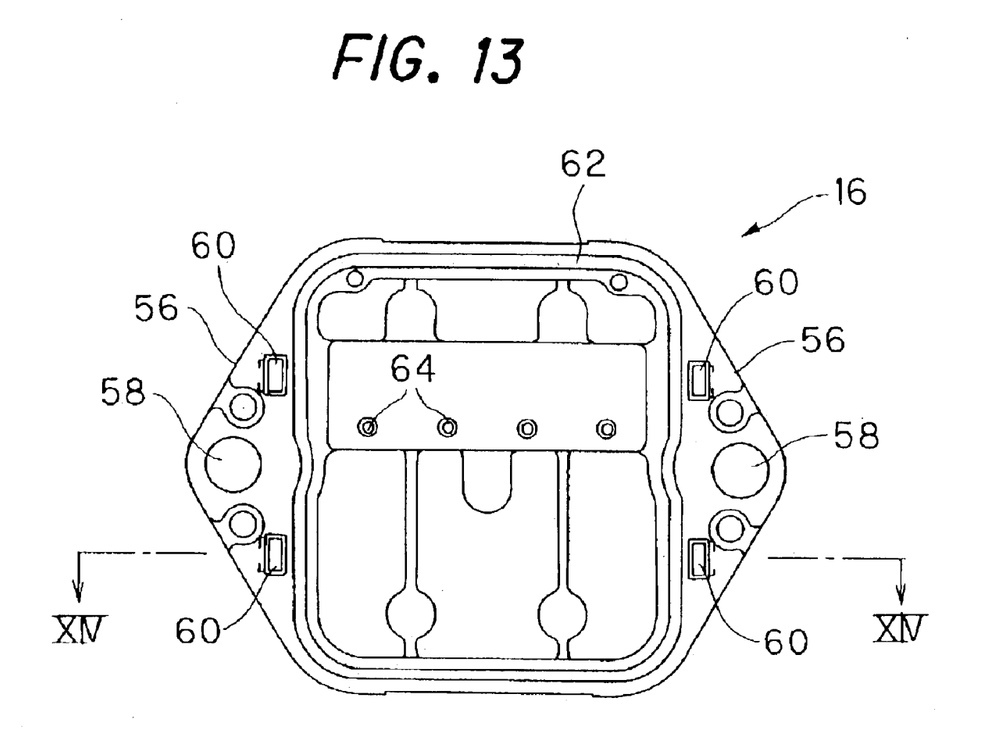
FIG. 13 is a top view of a heat sink of the case shown in FIG. 2.
Figure 14:
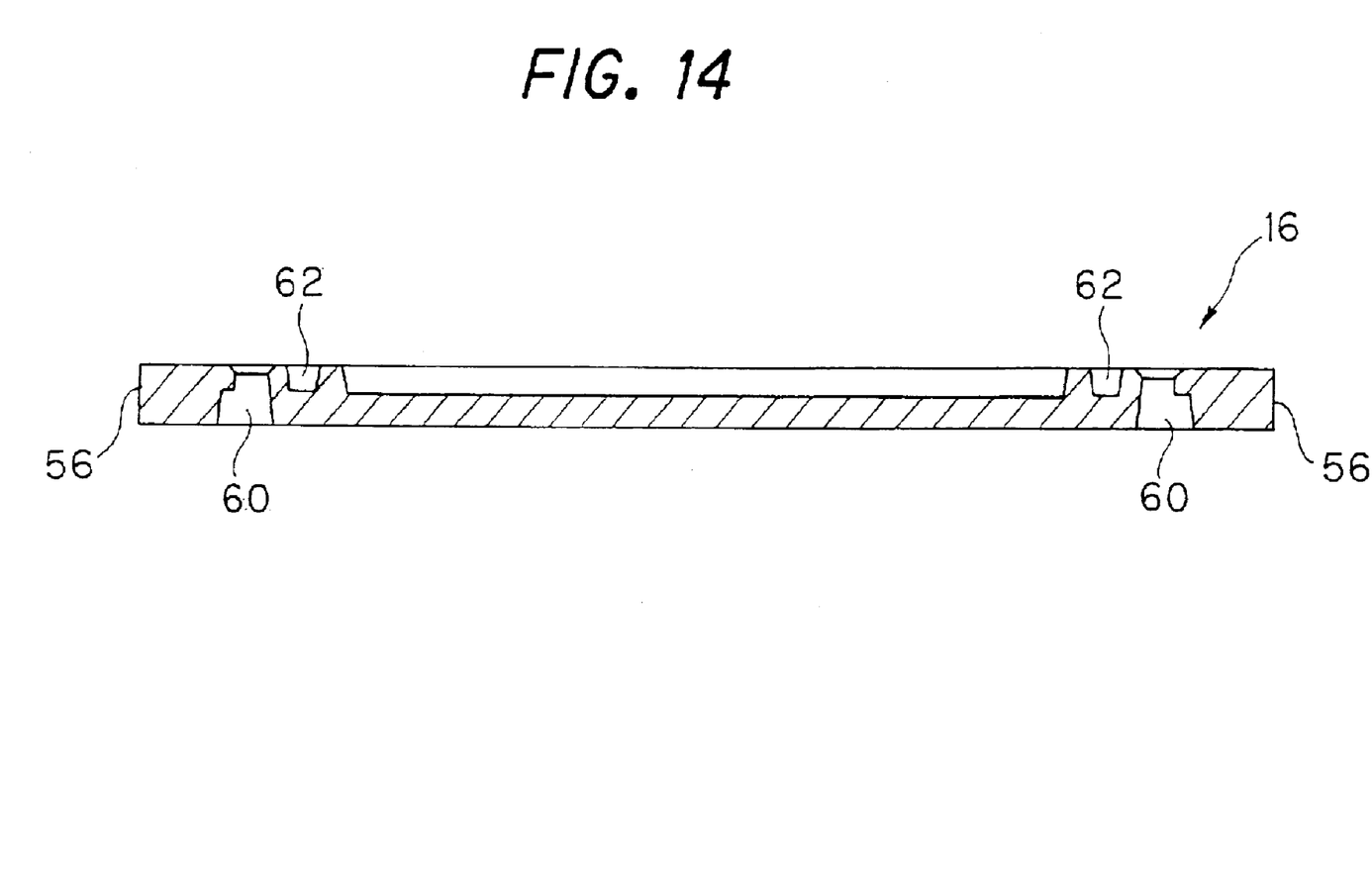
FIG. 14 is an enlarged sectional view taken along line XIV—XIV in FIG. 13.

FIG. 13 is a top view of the heat sink 16 and FIG. 14 is an enlarged sectional view thereof taken along line XIV—

XIV in FIG. 13. The heat sink 16 will now be explained with reference to FIGS. 2, 13 and 14.

The heat sink 16 is formed to have a hexagonal shape as viewed from the top and is equipped on opposite sides with two generally triangular heat sink flanges 56. Each heat sink flange 56 is formed with a heat sink bolt hole 58 at a location corresponding to one of the bolt holes 34 of the case body 12 and is also formed with two second engagement holes 60 each for receiving one of the heat sink fastening claws 42 and engaging the projection 42b.

A second annular recession 62 for receiving the first annular ridge 40 of the case body 12 is formed at a location corresponding to the first annular ridge 40. A plurality (4) bolt holes 64 for fastening electronic components are formed at appropriate locations of the heat sink 16 and, as shown in FIG. 2, heat-generating electronic components such as power transistors 66 are fastened with bolts 68.

Figure 15:
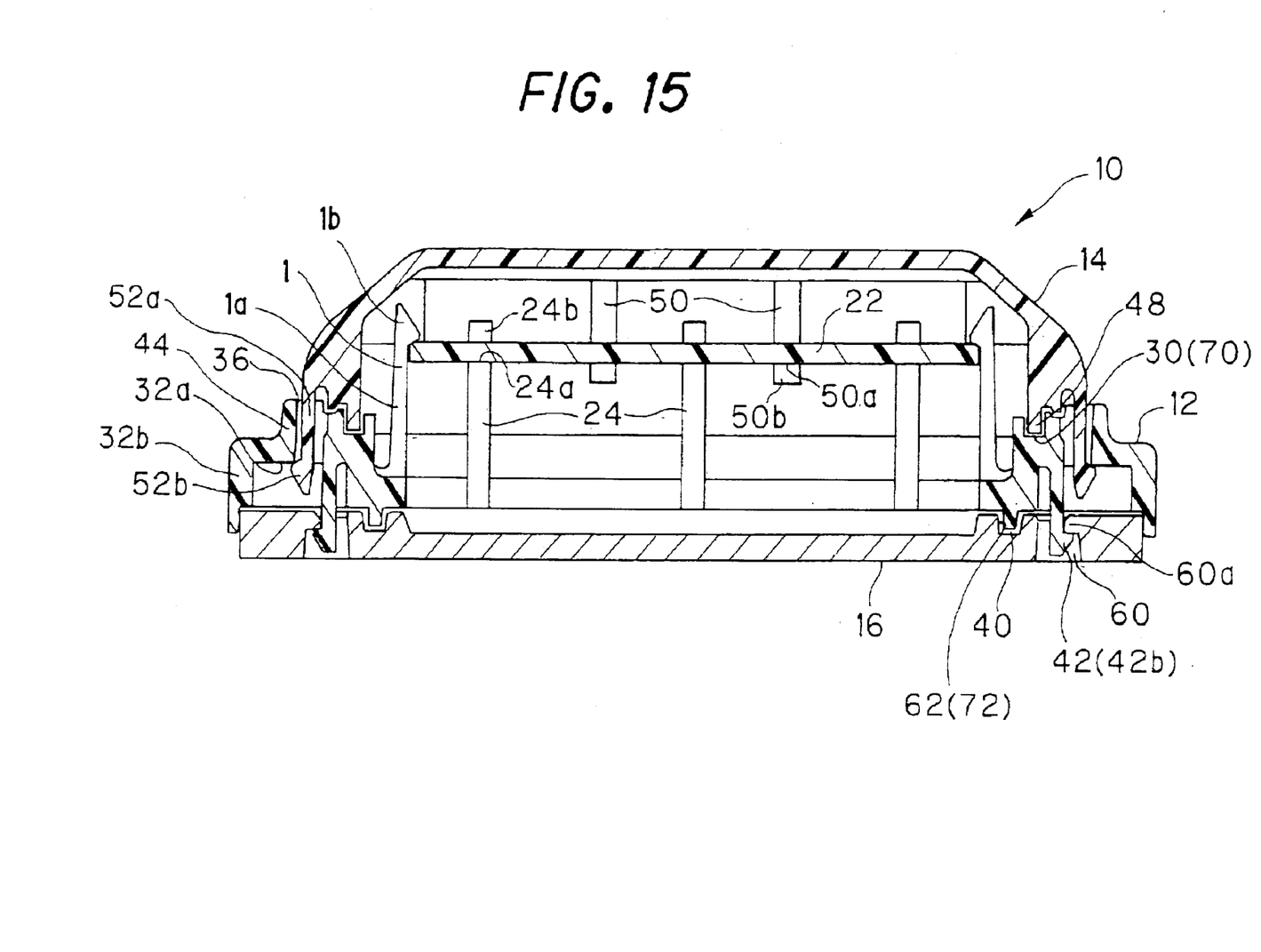
FIG. 15 is an enlarged sectional view of the case shown in FIG. 2.

FIG. 15 is a sectional view (taken at the same section as those of FIGS. 3, 4, 10 and 13) showing the fully assembled state with the board 22 housed in the case 10.

As shown in FIG. 15, the board 22 is clamped between the upper end surfaces 24a of the first ribs 24 and the projections 1b (more precisely the board contact surfaces 1b1) of the board fastening claws 1, thereby being immobilized at the prescribed location in the case 10. In addition, the cover 14 is attached to the case body 12 by engagement of the projections 52b of the cover fastening claws 52 with the first engagement holes 36, more precisely the lower surfaces 32a (the aforesaid prescribed regions) of the flanges 32.

Attachment of the cover 14 to the case body 12 further clamps the board 22 between the upper end surfaces 24a of the first ribs 24 and the lower end surfaces 50a of the second ribs 50. As a result, the board 22 is still more reliably fixed at the prescribed location.

The attachment of the heat sink 16 to the case body 12 is accomplished by engagement of the projections 42b of the heat sink fastening claws 42 formed in the case body 12 with the second engagement holes 60 formed in the heat sink 16, more precisely with the engagement portions 60a (the aforesaid prescribed regions) formed inside the second engagement holes 60.

The covers 44 are formed to cover the legs 52a of the cover fastening claws 52 over all or a part of their length. They therefore prevent a worker or anyone else from touching the legs 52a, i.e., from applying a force to a leg 52a in the direction of the case interior (in the direction enabling extraction of the projection 52b from the first engagement hole 36). Detachment of the cover 14 from the case body is therefore prevented.

Further, the second annular ridge 48 formed on the cover 14 fits into the first annular recession 30 formed on the case body 12, and thermosetting adhesive applied beforehand to the first annular recession 30 spreads through a first gap 70 formed between the first annular recession 30 and the second annular ridge 48. This enhances the strength and watertightness of the case 10.

Since the engagement of the cover fastening claws 52 and the first engagement holes 36 fixes the case body 12 and the cover 14 together, no jig is required while the adhesive 74 is setting. The adhesive need not be used when the degree of strength and watertightness required is not particularly high.

Further, thermosetting adhesive applied beforehand to the second annular recession 62 formed in the heat sink 16 spreads through a second gap 72 formed between the second annular recession 62 and the first annular ridge 40. This enhances the strength and watertightness of the case 10.

Since the engagement of the heat sink fastening claws 42 and the second engagement holes 60 fixes the case body 12 and the heat sink 16 together, no jig is required while the adhesive is setting. The adhesive need not be used when the degree of strength and watertightness required is not particularly high.

Moreover, the legs 42a of the heat sink fastening claws 42 are formed on the side wall of the case body 12, i.e., farther toward the case interior than the side wall 32b of the flanges 32. Since this prevents someone such as a worker from touching the leg 42a, it prevents detachment of the heat sink 16 from the case body 12.

The engagement portions 60a engaged by the projections 42b are formed inside the second engagement holes 60 formed in the heat sink 16. In other words, they are formed inside the space defined by the external shape of the sink 16 at locations continuous with the external space. The heat sink 16 can therefore be prevented from separating from the case body 12 while enabling its detachment by finger-operation of the projections 42b whenever required.

The finished case 10 is installed at the desired location, such as in a vehicle engine compartment, by passing bolts (not shown) through the bolt holes 34 formed in the flanges 32 of the case body 12 and the heat sink bolt holes 58 formed in the heat sink flanges 56 of the heat sink 16. In the case of installation in an engine compartment, it is preferable to enhance the strength and watertightness of the assembly not only by fastening the assembled heat sink 16, case body 12 and cover 14 by engaging the claws as explained in the foregoing but also by bonding them together with adhesive. On the other hand, when installing the case 10 in a relatively moderate environment, such as in a vehicle passenger compartment, adequate reliability can be obtained even if the assembled heat sink 16, case body 12 and cover 14 are fastened together only by engaging the claws.

The embodiment is thus configured to have a fastening member (claw-like hook 1) for an electronic circuit board (22) including: an elastically deformable leg (1a) formed in a case (10) for housing the electronic circuit board (22); and a projection (1b) formed continuous with the leg (1a) to be engaged with the electronic circuit board (22) so as to fasten the electronic circuit board on a prescribed mounting surface (upper end surface 24a) in the case; wherein the improvement comprises: the projection (1b) is engaged with the electronic circuit board (22) such that a prescribed angle (more specifically 31 to 33 degrees) is formed between a surface of the projection (1b1) contacting the electronic circuit board (22), when the electronic circuit board (22) is fastened on the mounting surface (24a) in the case (10).

In the fastening member, the prescribed angle is determined based on stress acting (more precisely acting on the electronic circuit board 22 and the fastening member (1)) at a time when the electronic circuit board (22) is fastened on the mounting surface (24a) in the case (10).

The entire disclosure of Japanese Patent Application No. 2002-028963 filed on Feb. 6, 2002, including specification, claims, drawings and summary, is incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A fastening member for an electronic circuit board, including:

an elastically deformable leg formed in a case for housing the electronic circuit board; and a projection formed continuous with the leg to be engaged with the electronic circuit board so as to fasten the electronic circuit board on a prescribed mounting surface in the case;

wherein the improvement comprises:

the projection is engaged with the electronic circuit board such that a prescribed non-zero angle is formed between a surface of the projection contacting the electronic circuit board and a surface of the electronic circuit board contacting said contacting surface of the projection, when the electronic circuit board is fastened on the mounting surface in the case; and when the electronic circuit board is fastened on the mounting surface in the case, the electronic circuit board is positioned over an area of the case, and the elastically deformable leg is positioned in the case outside of the area of the case under the electronic circuit board.

2. A fastening member according to claim 1, wherein the prescribed angle is determined based on stress acting at a time when the electronic circuit board is fastened on the mounting surface in the case.

* * * * *